(12) United States Patent
Perryman et al.

(10) Patent No.: US 10,263,382 B1
(45) Date of Patent: Apr. 16, 2019

(54) DEVICE, SYSTEM AND METHOD WITH BURST MODE LASER SOURCE SYSTEM FORMING LASER-INDUCED RADIO FREQUENCY (LIRF) ENERGY

(71) Applicant: LOCKHEED MARTIN CORPORATION, Bethesda, MD (US)

(72) Inventors: Gary P. Perryman, Nathrop, CO (US); James R. Wood, Grapevine, TX (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 15/498,744

(22) Filed: Apr. 27, 2017

(51) Int. Cl.
*H01S 3/00* (2006.01)
*H01S 3/23* (2006.01)
*H01S 3/16* (2006.01)
*H01S 5/00* (2006.01)
*H01S 3/102* (2006.01)
*H01S 3/10* (2006.01)

(52) U.S. Cl.
CPC .......... *H01S 3/0057* (2013.01); *H01S 3/1024* (2013.01); *H01S 3/10046* (2013.01); *H01S 3/1625* (2013.01); *H01S 3/2316* (2013.01); *H01S 3/2325* (2013.01); *H01S 5/0057* (2013.01)

(58) Field of Classification Search
CPC .. H01S 3/0057; H01S 3/1024; H01S 3/10046; H01S 5/0057; H01S 3/2325; H01S 3/1625; H01S 3/2316
See application file for complete search history.

(56) References Cited

U.S. PATENT DOCUMENTS

| | | | |
|---|---|---|---|
| 4,574,249 A | 3/1986 | Williams | |
| 6,160,480 A | 12/2000 | Su-yueh | |
| 7,872,794 B1 | 1/2011 | Minelly et al. | |
| 2011/0122895 A1 | 5/2011 | Savage-Leuchs et al. | |
| 2011/0182306 A1* | 7/2011 | Hosseini | H01S 3/235 372/25 |
| 2012/0300290 A1 | 11/2012 | Kakui | |
| 2014/0300951 A1* | 10/2014 | Messerly | H01S 3/06758 359/334 |
| 2016/0197451 A1 | 7/2016 | Kraemer et al. | |

* cited by examiner

*Primary Examiner* — Yuanda Zhang
(74) *Attorney, Agent, or Firm* — Terry M. Sanks, Esq.; Beusse Wolter Sanks & Maire, PLLC

(57) ABSTRACT

A device comprising a master clock configured to produce a pulse sequence having a wideband light signal of approximately 800 nanometers or red visible wavelength of a predetermined amplitude. The device comprises X laser amplifiers along a common optical path each amplifier being triggered by a burst of X pulses with high-peak power and high-average power. The X laser amplifiers receive the pulse sequence of the master clock and sequentially amplifying the pulse sequence wherein a last laser amplifier of the X laser amplifiers produces an amplified pulse sequence. A compressor is configured to compress the amplified pulse sequence to produce a laser signal having a sequence of directed energy (DE) pulses each DE pulse having a pulse width in a femtosecond range to induce when striking a solid surface of a target object transient electric fields in a microwave frequency range. A system and method are also provided.

19 Claims, 8 Drawing Sheets

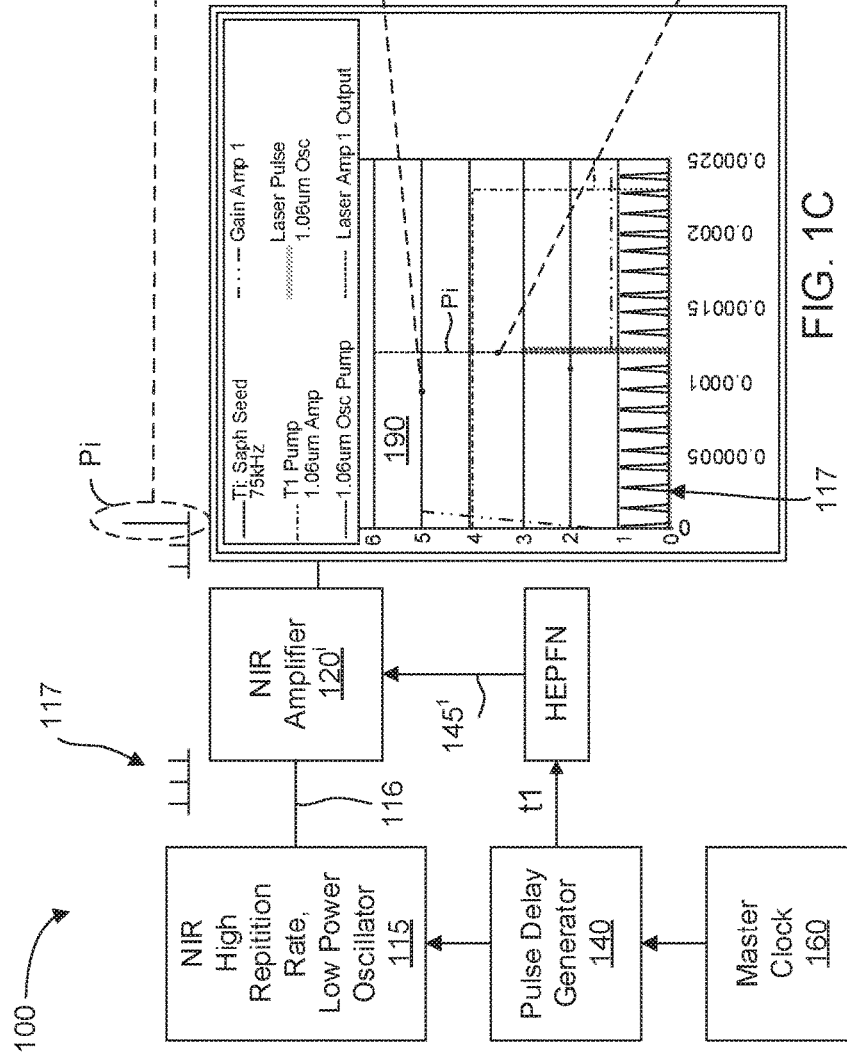

DEVICE, SYSTEM AND METHOD WITH BURST MODE LASER SOURCE SYSTEM FORMING LASER-INDUCED RADIO FREQUENCY (LIRF) ENERGY

BACKGROUND

Embodiments relate to a device, a system, and a method with a burst mode laser source system forming laser-induced radio frequency (LIRF) energy.

Traditional laser sources may be configured to have either high-average power or high-peak power. However, the laser configurations fall short from providing both characteristics of high-average power and high-peak power. For some applications, laser sources which provide a high-peak power with a high-average power burst are needed. The high-peak power is generally defined by multiple joules per pulse, where the pulse is <=10 nanoseconds. High-average power is approximately >=1000 Watts (1000 Joules/sec.).

In order to achieve high-peak and high-average power, traditionally the power supplies for the laser source would be scaled for the thermal loads of the high-average power. The short pulse widths might be limited to a few hundred picoseconds and repetition rates in the range of 50 to 100 Hertz (Hz). This solution is very expensive. However, for some applications which require shorter pulse widths, higher repetition rates are required in the range of kilohertz (kHz) or higher.

Current laser source designs have unsolvable thermal problems which drive optical instability and poor or worse operation of the laser amplifiers causing mechanical problems. The current laser source design may provide for a higher repetition rate and highest energy per pulse to pump other materials (i.e., infrared (IR) and Titanium Sapphire) to generate increased peak powers, but only at the repetition rate of the pump laser. Typical repetition rates would be 10 to 20 Hz pumps and multi-joule energy at a few hundred picoseconds to a few nanoseconds. This pumping laser would energize an additional stage of oscillation with higher optical bandwidth and may utilize chirped pulse amplification (CPA) yield with temporally shorter pulses.

SUMMARY

Embodiments relate to a device, a system, and a method with a burst mode laser source system forming laser-induced radio frequency (LIRF) energy. An embodiment includes a device comprising a master clock having a microwave seed and being configured to produce a pulse sequence having a wideband light signal of approximately 800 nanometers or red visible wavelength of a predetermined amplitude. The device includes X laser amplifiers along a common optical path wherein X is an integer number. Each amplifier is configured to be triggered by a burst of X pumping pulses with high-peak power and high-average power over the burst of X pumping pulses. The X laser amplifiers receive the pulse sequence of the master clock in series and sequentially amplify at least one pulse in the pulse sequence of the master clock. A last laser amplifier of the X laser amplifiers produces an amplified pulse sequence. A compressor, along the common optical path, being configured to compress the amplified pulse sequence to produce a laser signal having a sequence of directed energy (DE) pulses each DE pulse having a pulse width in a femtosecond range to induce, when striking a solid surface of a target object, transient electric fields in a microwave frequency range.

An aspect of the embodiments includes a system comprising a high-average power and peak-power burst mode laser amplification stage having a plurality of X series coupled amplifiers having a first common optical path. The plurality of X series amplifies a power parameter of X oscillator pulses. The plurality of amplifiers are triggered in sequence in accordance with a high repetition rate so that an output from a last amplifier of the plurality of X series coupled amplifiers is a burst of X pumping pulses with high-peak power and high-average power over the burst of X pumping pulses wherein the X is an integer number. The system includes a laser-induced radio frequency (LIRF) stage having X laser amplifiers spaced along a second common optical path and being responsive to the burst of X pumping pulses. The X laser amplifiers receive a pulse sequence from a master clock having a microwave seed rate to produce a burst pulse laser signal having a sequence of directed energy (DE) pulses, each DE pulse having a pulse width in a femtosecond range to induce, when striking a solid surface of a target object, transient electric fields in a microwave frequency range.

Another aspect of the embodiments includes a method comprising producing, by a master clock having a microwave seed, a pulse sequence having a wideband light signal of approximately 800 nanometers or red visible wavelength of a predetermined amplitude; producing a burst mode laser amplified pumping oscillator signal having a burst of X pumping pulses with high-average power and peak-power; sequentially amplifying, by X laser amplifiers along a common optical path, the pulse sequence of the master clock, each amplifier being responsive to a burst of X pumping pulses, wherein a last laser amplifier of the X laser amplifiers outputting an amplified pulse sequence; and compressing, by a compressor along the common optical path, the amplified pulse sequence to produce a laser signal having a sequence of directed energy (DE) pulses, each DE pulse having a pulse width in a femtosecond range to induce, when striking a solid surface of a target object, transient electric fields in a microwave frequency range.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which:

FIG. 1B illustrates a partial block diagram of the device of FIG. 1A;

FIG. 1C illustrates an amplifier pulse gain profile for an $i^{th}$ amplifier;

FIG. 1D illustrates a graphical representation of a gain curve over time profile for an $i^{th}$ amplifier in FIG. 1B according to the amplifier pulse gain profile of FIG. 1C;

FIG. 1E illustrates a graphical representation of a pulse energy curve over time profile for the $i^{th}$ amplifier in FIG. 1B according to the amplifier pulse gain profile of FIG. 1C;

DETAILED DESCRIPTION

Figure 1A:
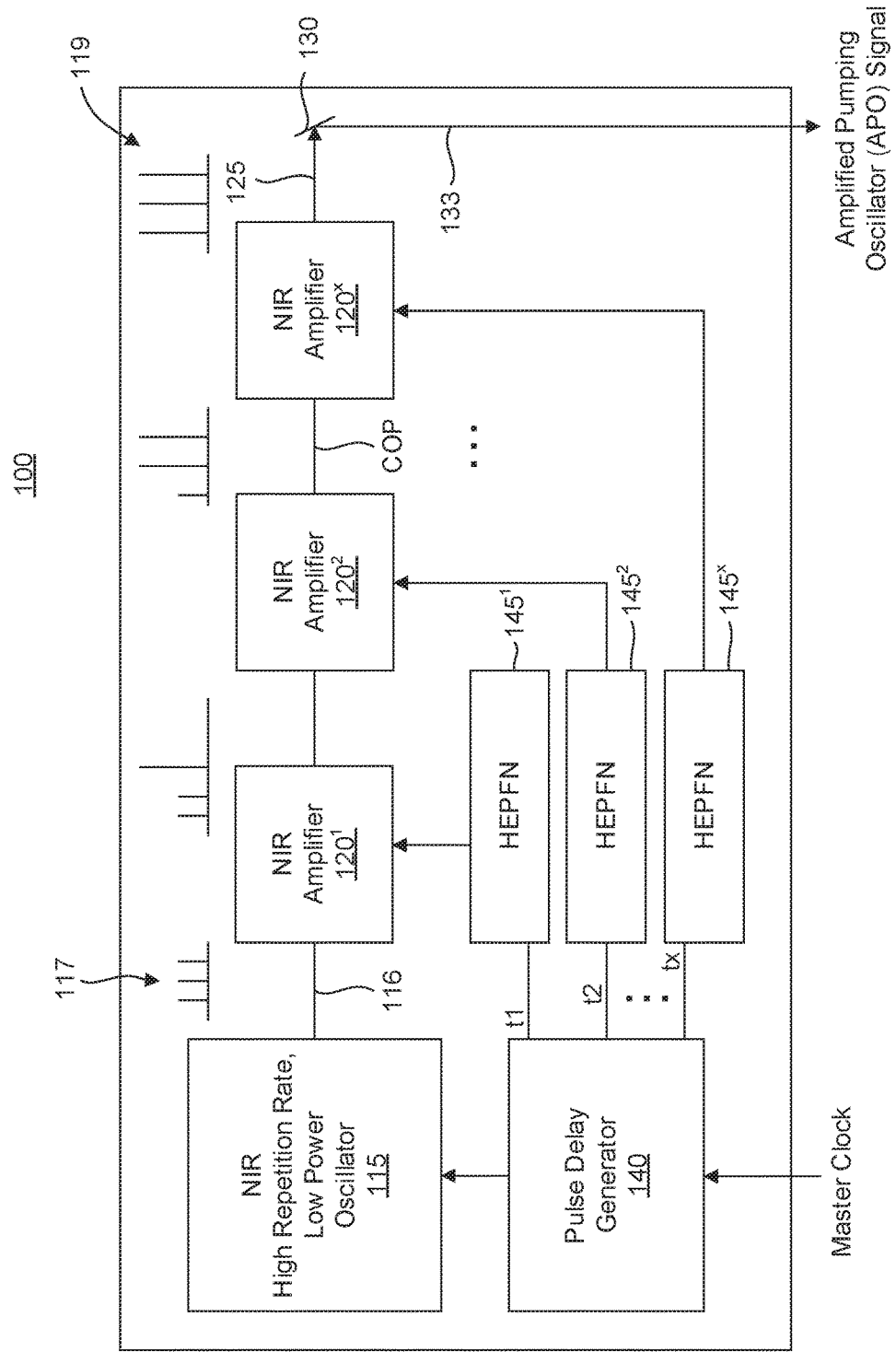
FIG. 1A illustrates a block diagram of a device for generating a cascaded burst mode laser amplified pumping oscillator (APO) signal.

Embodiments are described herein with reference to the attached figures wherein like reference numerals are used throughout the figures to designate similar or equivalent elements. The figures are not drawn to scale and they are provided merely to illustrate aspects disclosed herein. Several disclosed aspects are described below with reference to non-limiting example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. The embodiments are not limited by the illustrated ordering of acts or events, as some acts may occur in different orders and/or concurrently with other acts or events. Furthermore, not all illustrated acts or events are required to implement a methodology in accordance with the embodiments.

Notwithstanding that the numerical ranges and parameters setting forth the broad scope are approximations, the numerical values set forth in specific non-limiting examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 4.

FIG. 1A illustrates a block diagram of a device 100 for generating a cascaded burst mode laser amplified pumping oscillator (APO) signal. The device 100 may comprise a low-power oscillator 115 having an oscillator output 116, the oscillator 115 may be triggered to produce X number of oscillator pulses 117 in series at a high repetition rate from the oscillator output 116 wherein X is an integer greater than zero (0) and X is a function of the number of laser amplifiers as will be discussed in more detail in relation to FIG. 2.

The device 100 may comprise a plurality of X series coupled amplifiers $120^1, 120^2, \ldots, 120^X$ having a common optical path COP. The plurality of X series coupled amplifiers $120^1, 120^2, \ldots, 120^X$ amplify a power parameter of the X number of oscillator pulses 117. A first amplifier $120^1$ of the plurality of amplifiers $120^1, 120^2, \ldots, 120^X$ may be coupled to the oscillator output 116. The plurality of amplifiers $120^1, 120^2, \ldots, 120^X$ may be triggered in sequence in accordance with the high repetition rate of the oscillator so that an output 125 from a last amplifier $120^X$ of the plurality of X series coupled amplifiers $120^1, 120^2, \ldots, 120^X$ is a burst of X amplified pumping oscillator (APO) pulses with high-peak power and high-average power over the burst of APO pulses 119. The burst of X APO pulses 119 will be described in more detail. Each pulse in the burst of X APO pulses 119 may have a first amplitude and a first pulse width. Each pulse of the X number of oscillator pulses 117 may have a second amplitude and a second pulse width. The first amplitude is different from the second amplitude. In some embodiments, the first pulse width substantially equals the second pulse width. Moreover, the spacing between adjacent pulses of the burst of X APO pulses 119 may be the same as the spacing between adjacent pulses of the X number of oscillator pulses 117. The burst of X APO pulses 119 are sometimes referred to herein as the burst of X pumping pulses.

The power parameter of each pulse of the X number of pulses 116 is approximately 1-10 milli-joules (mJ) per pulse, for example. Each amplifier amplifies the power parameter by a factor of approximately 10-50, for example. In some embodiments, the factor may be in the range of 1-10. Each amplifier of the plurality of amplifiers $120^1, 120^2, \ldots, 120^X$ may be a near infrared (NIR) amplifier; the oscillator output 116 of the oscillator 115 may have a laser pulse in the NIR wavelength. The plurality of amplifiers $120^1, 120^2, \ldots, 120^X$ may be laser pumped amplifiers.

By way of non-limiting example, the NIR wavelength may be 1.06 um for both the oscillator 115 and the amplifier. Nonetheless, other NIR wavelengths may be used. The oscillator 115 may be a laser pulsed oscillator having a high repetitious oscillator with pulse repetition frequency (PRF) rate of 300 μsec wherein each pulse may have a pulse width of approximately 300 picoseconds (ps).

The device 100 may further comprise a pulse delay generator 140 to trigger the oscillator 115 to produce the X number of oscillator pulses 117 in series and to trigger an $i^{th}$ amplifier for only an $i^{th}$ pulse of the X number of pulses 116. By way of non-limiting example, the first amplifier (i=1) will amplify the first pulse. The second amplifier (i=2) will amplify the second pulse. The X amplifier (i=X) will amplify the X pulse.

In some embodiments, the pulse delay generator 140 may be configured to trigger the oscillator 116 to produce the X number of oscillator pulses 117 in series and to trigger a respective one amplifier of the plurality of X series coupled amplifiers $120^1, 120^2, \ldots, 120^X$ for only a respective one pulse of the X number of oscillator pulses. In other words, the first amplifier $120^1$ may amplify the last pulse of the X number of pulses 117, while the last amplifier $120^X$ may amplify the first pulse of the X number of oscillator pulses 117.

The pulse delay generator 140 may be coupled to a plurality of high energy pulse forming networks (HEPFNs) $145^1, 145^2, \ldots, 145^X$. A corresponding one high energy pulse forming network (HEPFN) is coupled to a respective one amplifier to trigger the respective one amplifier. Each HEPFN receives a timing control signal t1, t2, ..., tX from the pulse delay generator 140 to control the timing of the triggering of the related amplifier. The pulse delay generator 140 may include a processing unit to perform the timing control. The respective one amplifier $120^1, 120^2, \ldots, 120^X$ amplifies the power parameter of only one pulse, wherein the respective one amplifier is gated for operation by the corresponding one HEPFN $145^1, 145^2, \ldots, 145^X$ so that a gain of the amplifier has an operational gain length of time which is longer than the pulse width of said only one oscillator pulse. The plurality of amplifier $120^1$, $120^2$, ..., $120^X$ are controlled to have a cascaded gating time so that each amplifier amplifies only one non-amplified pulse of the X number of oscillator pulses 117. The HEPFN may be used to drive optical flash lamps or arrays of the laser diodes to provide the optical pumping energy needed for each NIR amplifier of the plurality of amplifier $120^1$, $120^2$, ..., $120^X$. By way of non-limiting example, the pump pulse repetition rate is set by the cascade architecture of pumped Nd:YAG (neodymium-doped:yttrium aluminum garnet) rods of the cascaded amplifiers of the amplifier chain.

The plurality of amplifier $120^1$, $120^2$, ..., $120^X$ may sometimes be referred to as an amplifier chain. The amplifier chain may be energized or triggered at a nominal relative low repetition rate (i.e., 10 Hz), but the resulting burst of X APO pulses 119 would be at a considerably higher repetition rate. In other words, the amplifier chain delivers bursts in the kHz range, at high-average power and high-peak power, but these bursts only occur at much lower rates such as in the range of 10-30 Hz, by way of non-limiting example.

By way of non-limiting example, as shown in FIG. 1A, the first amplifier $120^1$ may receive the X number of oscillator pulses 117 propagated along the common optical path COP, but only amplifies one pulse (e.g., the first pulse) of the X number of oscillator pulses 117. The second amplifier $120^2$ may receive the X number of oscillator pulses 117 propagated along the common optical path COP, but only amplifies one pulse (e.g., the second pulse) of the X number of oscillator pulses 117. The X number of oscillator pulses 117 received at the second amplifier includes a first amplified pulse followed by X–1 pulses having the original pulse amplitude (or unamplified). The first pulse was previously amplified by the first amplifier. The X amplifier $120^X$ receives the X number of oscillator pulses 117 propagated along the common optical path COP, but only amplifies one pulse (e.g., the $X^{th}$ pulse) of the X number of oscillator pulses 117. The X number of oscillator pulses 117 received at the X amplifier includes X–1 amplified pulses followed by one (last) non-amplified oscillator pulse or Xth oscillator pulse.

The output 125 from a last amplifier of the plurality of X series coupled amplifiers $120^1$, $120^2$, ..., $120^X$ may be sent to an optical or light directing component 130. The directing component 130 may be a mirror or reflector. The directing component 130 directs the output 125 to path 133. The output 125 is a cascaded burst mode laser amplified pumping oscillator (APO) signal.

FIG. 1B illustrates a partial block diagram of the device 100 of FIG. 1A which produces pulse Pi in pulses 117. FIG. 1C illustrates an amplifier pulse gain profile 190 to amplify pulse Pi by an $i^{th}$ amplifier. In FIG. 1C, the pulse Pi from amplifier $120^i$ being amplified by the gain profile shown. The amplifier $120^i$ is gated, energized or triggered for operation by the corresponding one HEPFN $145^1$, $145^2$, ..., $145^X$ so that a gain of the amplifier has an operational gain length of time which is longer than the pulse width of only one pulse.

FIG. 1D illustrates a graphical representation 192 of a gain (g0i) curve over time ($Trt_i$) profile for an $i^{th}$ amplifier $120^i$ in FIG. 1B according to the amplifier pulse gain profile 190 of FIG. 1C wherein the gain (g0i) is the energy gain ratio of energy contained in the population inversion of the gain media to the incoherent energy in the media not at the population inversion. The graphical representation 192 of a gain (g0i) curve over time ($Trt_i$) profile for an $i^{th}$ amplifier $120^i$ depicts a single stage detailed operation of a high power pulse. The high-average power curve profile depicted at the burst of X APO pulses 119 (FIG. 1A).

FIG. 1E illustrates a graphical representation 196 of a pulse energy curve over time profile for the $i^{th}$ amplifier $120^i$ in FIG. 1B according to the amplifier pulse gain profile 190 of FIG. 1C. In FIG. 1E, the graphical representation 196 of a pulse energy curve over time profile for the $i^{th}$ amplifier $120^i$ has a high-peak power profile. The pulse energy curve is represented in arbitrary units (au) for illustrative purposes.

FIG. 1B illustrates device 100 receiving a master clock signal from a master clock 160 which may be a Titanium-Sapphire seed clock of 75 kHz. The master clock 160 may be used to trigger the pulse delay generator 140. The pulse delay generator 140 may simultaneously trigger the oscillator 115 and at least one of the HEPFNs $145^1$, $145^2$, ..., $145^X$. The pulse delay generator 140 may trigger all HEPFNs or just one at a time. The pulse delay generator 140 may provide cascaded timing control signals to the HEPFNs $145^1$, $145^2$, ..., $145^X$. In some embodiments, the pulse delay generator 140 may provide different timing control signals to the HEPFN $145^1$, $145^2$, ..., $145^X$ simultaneously or the timing control signals may be based on the order of gating the amplifiers.

The total pulse energy ($Ert_i$) is equal to the photon density $\phi_i$ (times) the volume (times) energy per photon (EL) where the volume is defined as (A·c·dt) and A is area, c is speed of light in the media, dt is the incremental time step toward the accumulative build-up time and i is an integer corresponding to an $i^{th}$ amplifier $120^i$. The accumulative build-up time ($Trt_i$)=i·dt·$10^9$. The graphical representation 190 corresponds to a small signal gain and the total gain over time. The graphical representation 196 corresponds to the total pulse energy ($Ert_i$) profile. The amplifier $120^i$ is gated, energized or triggered so that the corresponding pulse Pi for which the amplifier is timed to amplify from the X number pulses 117 corresponding in time to the high-peak point of the curve for the total pulse energy ($Ert_i$) in FIG. 1E.

The small signal gain is that energy gain taken in by the laser media from the non-coherent optical pump and that is able to be released as coherent energy as an output pulse. The signal gain is higher as the non-coherent light is first delivered over time, and then exponentially gets smaller as the population inversion becomes near a maximum condition for the laser gain media. The gain is high until the gain media has reached a population inversion and is ready to be dumped from the laser media. The model shown has the gain at a maximum in graphical representation 192 and then dropping in time. When the light leaves the gain media as a coherent pulse, the gain is depleted, until more pumping light is presented into the media. The second trace on the model of the graphical representation 196 is the energy released from the laser gain media as a function of time.

The model of the graphical representation 190 shows the operation of the laser after optical cavity pumping and population inversion. This energy is then Q-switched to release the energy gained over the non-coherent optical pumping time in a ~10 ns coherent laser pulse which is then sent through the amplifiers $120^1$, $120^2$, ..., $120^X$ and on to deliver the energy as a pump to X laser amplifiers $370^1$, ..., $370^X$ (FIG. 3) wherein the laser amplifiers $370^1$, ..., $370^X$ may be wideband coherent amplifiers.

By way of non-limiting example, X number of NIR pulses with a 300 picosecond (ps) pulse width from the oscillator 115 are sent through the HEPFN biased amplifier stages and enters a fully HEPFN "pumped" stage, where the population is fully inverted. The amplifier $120^i$ then becomes the amplifier for the $i^{th}$ selected 300 ps NIR pulse. The 300 ps NIR pulses deliver the NIR energy in output 125 to path 133 as a pump to a burst pulse amplification stage 250.

Figure 2:
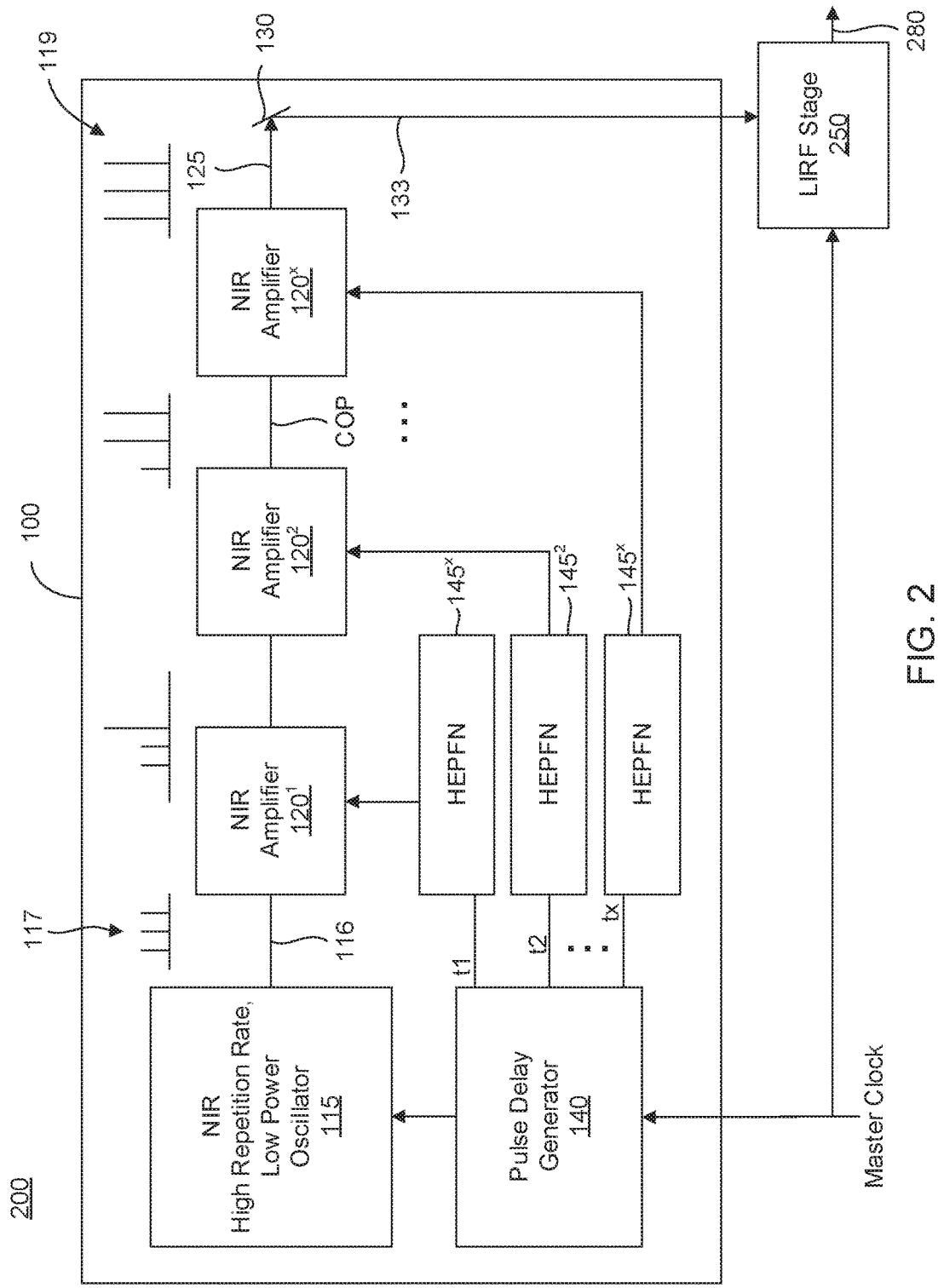
FIG. 2 illustrates a block diagram of a burst laser pump system for forming laser-induced radio frequency (LIRF) energy.

FIG. 2 illustrates a block diagram of a burst laser pump system 200 for forming laser-induced radio frequency (LIRF) energy when an output of the burst laser pump system 200 propagated through air strikes a solid surface. For the sake of brevity, the device 100 is the same as those in FIG. 1A and will not be described in relation to FIG. 2. The output 125 from a last amplifier of the plurality of X series coupled amplifiers $120^1, 120^2, \ldots, 120^X$ may be sent to an optical or light directing component 130. The directing component 130 may be a mirror or reflector. The directing component 130 directs the output 125 to path 133 which in turn is sent to an LIRF stage 250 which produces a burst laser output 280 at a femtosecond for propagation through air at a high intensity. The burst laser output 280 being configured as directed energy which when contacts a surface of a target effectuates laser-induced radio frequency (LIRF) energy. Both the LIRF stage 250 and the pulse delay generator 140 of the device 100 receive the master clock signal of the burst laser pump system 200.

The device 100 may produce a cascaded burst mode laser amplified pumping oscillator (APO) signal output for the control of the LIRF stage 250 to cause a high-peak power and high-average laser pumping pulse output such as for directed energy (DE) applications. In some embodiments, the LIRF stage 250 includes chirped pulse laser amplifiers to produce a laser signal which has high-peak power and high-average power at a femtosecond.

Figure 3:
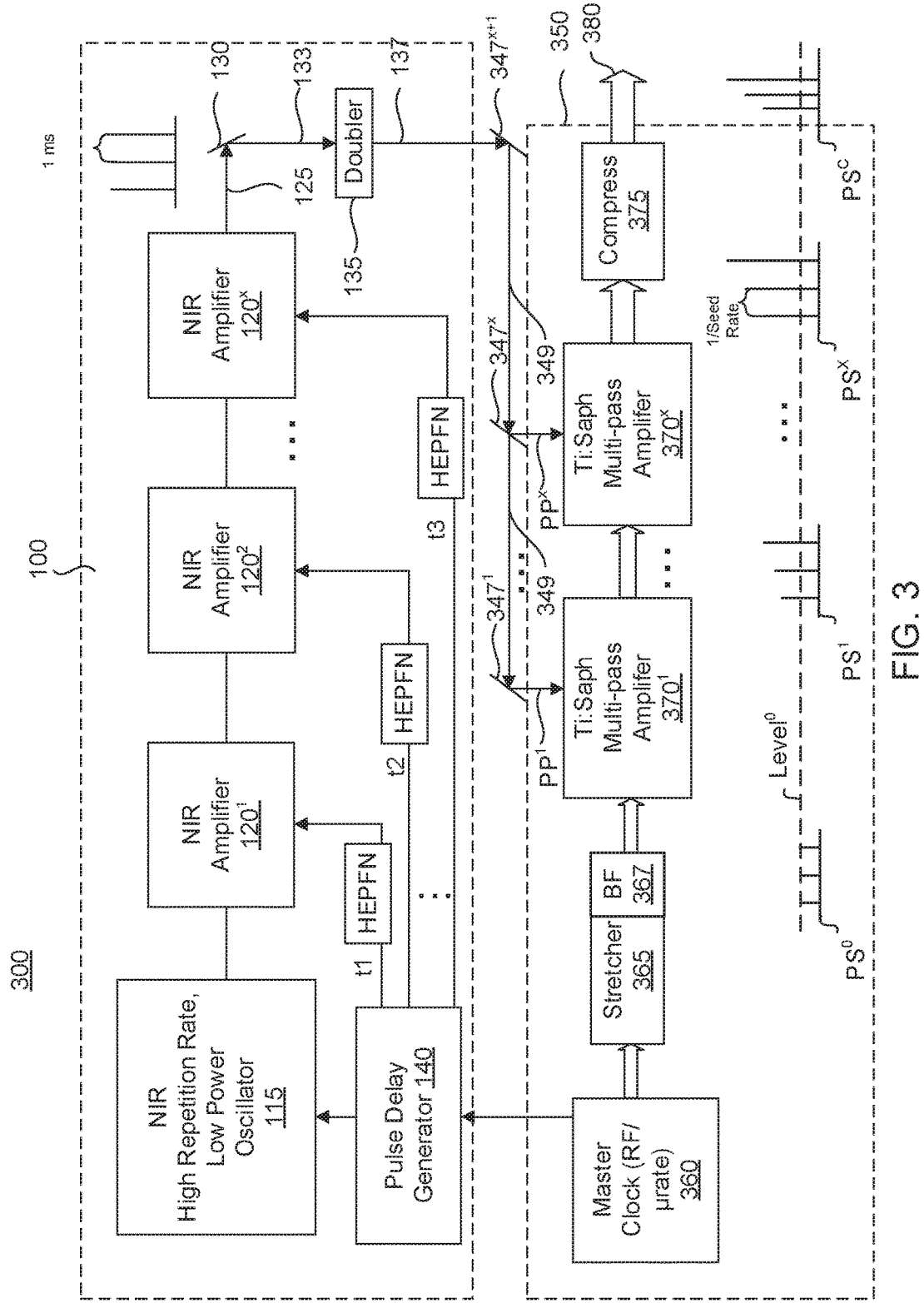
FIG. 3 illustrates a block diagram of a burst laser pump system for forming laser-induced radio frequency (LIRF) energy.

FIG. 3 illustrates a block diagram of a burst laser pump system 300 for forming laser-induced radio frequency (LIRF) energy. In this embodiment, the master clock 360 is shown as part of the LIRF stage 350. Nonetheless, the master clock 360 may be separate. Specifically, the master clock 360 may produce a pulse sequence having a wideband light signal of approximately 800 nanometers (nm) or red visible wavelength of a predetermined amplitude. Furthermore, the seed rate of the master clock 360 may be in the microwave range wherein the microwave range may be from approximately 300 MegaHertz (MHz) or 0.3 GigaHertz (GHz) to approximately 300 GHz. In some embodiments, the LIRF energy is laser-induced microwave emissions (LIME) energy. Hence, LIRF energy and LIME energy may be used interchangeably.

By way of non-limiting example, the LIRF stage 350 may comprise X laser amplifiers $370^1, \ldots, 370^X$ having a second common optical path $COP_2$ and being responsive to the burst of X APO pulses 119 (FIG. 1A). Each of the X laser amplifiers $370^1, \ldots, 370^X$ may comprise a Titanium Sapphire (Ti:Saph) multi-pass amplifier. The X laser amplifiers $370^1, \ldots, 370^X$ are coupled in series. In some embodiments, X equals 10.

In an embodiment, the output from the master clock 360 is sent (propagated) to a stretcher 365 to stretch the optical seed clock (master clock signal). In some embodiments, the output of the stretcher 365 may be coupled to a beam former unit 367 configured to form a predetermined beam configuration.

The output of the stretcher 365 and beam former (BF) 367, denoted as pulse sequence $PS^O$, is propagated to the first laser amplifier $370^1$ of the X laser amplifiers $370^1, \ldots, 370^X$. The superscript 0 denotes an input pulse sequence. The amplitude of the pulse sequence $PS^O$ has an amplitude level ($Level^O$). The amplitude level ($Level^O$) denotes an initial level of the master clock and represented by a dashed level line. The amplitude level ($Level^O$) is the amplitude of the signal being fed into the first laser amplifier of the laser amplifiers $370^1, \ldots, 370^X$. The amplitude of each pulse in the pulse sequence $PS^O$ has the same amplitude. In some embodiments, the pulse sequence $PS^O$ may include a pulse width of approximately 300 picosecond (ps).

Each laser amplifier $370^1, \ldots, 370^X$ receives a pulse sequence from the immediately preceding laser amplifier. For example, pulse sequence $PS^1$ is the pulse sequence at the output of the first laser amplifier $370^1$ wherein the pulse sequence $PS^1$ is the input pulse sequence for the second laser amplifier of the X laser amplifiers $370^1, \ldots, 370^X$. In some embodiments, the amplitude of each pulse in the pulse sequences $PS^1$ through $PS^X$ varies such that a first pulse of the sequence has a higher amplitude than the amplitude of the immediately adjacent second pulse of the sequence of X pulses of the master clock. In other words, in some embodiments, the amplification from the first-in pulse of the pulse sequence to the last-in pulse of the pulse sequence propagated through the X laser amplifiers $370^1, \ldots, 370^X$ may have gradually decreasing amplitudes. Therefore, the first-out pulse from the LIRF stage 350 may have the highest (first) amplitude and the last-out pulse may have the lowest (last) amplitude. The first amplitude having an amplitude which is greater than the last amplitude.

The pulse sequence $PS^X$ is the pulse sequence at the output of the last or X laser amplifier $370^X$. Each laser amplifier $370^1, \ldots, 370^X$ also receives a corresponding amplified pumping oscillator (APO) pulse in the cascaded burst mode laser APO signal. For example, first laser amplifier $370^1$ receives only one of the amplified pumping pulses $PP^1$ in the burst of X APO pulses 119 and the pulse sequence $PS^O$ from the stretcher 365 and/or beam former 367. The output of the first laser amplifier $370^1$ is denoted as pulse sequence $PS^1$.

Laser amplifier $370^X$ receives only one amplified pumping pulses $PP^X$ in the burst of X APO pulses 119 and the pulse sequence from the immediately previous laser amplifier. In some embodiments, $PP^1$ may be from amplifier $120^1$. The pumping pulse $PP^X$ may be from amplifier $120^X$. There is a one-to-one correspondence between the X pumping pulses 119 and the X laser amplifiers $370^1, \ldots, 370^X$.

By way of non-limiting example, the device 100 further includes a doubler 135 configured to double the frequency of the cascaded burst mode laser APO signal (i.e., output 125). The output 137 from doubler 135 may be sent to the LIRF stage 350 via a plurality of intermediary optical or light directing components $347^1, \ldots, 347^X, 347^{X+1}$ and optical path, denoted by lines 349. Light directing component $347^{X+1}$ receives the cascaded burst mode laser APO signal from the doubler 135 and directs the cascaded burst mode laser APO signal to directing component $347^X$ so that the signal portion with pumping pulse $PP^X$ may be directed to and received by laser amplifier $370^X$. The doubler 135 may be a frequency doubler including a non-linear crystal to double the frequency of the input signal.

The directing component $347^X$ in turn directs the cascaded burst mode laser APO signal to the next directing component. The cascaded burst mode laser APO signal is directed through the directing components $347^1, \ldots, 347^X$. Directing component $347^1$ directs the signal with pumping pulse $PP^1$ to the laser amplifier $370^1$. The output of the last laser amplifier $370^X$ may be propagated to a pulse compressor 375.

The compressor 375 may compress or shorten the pulse width of the laser pulses at the output of the last laser amplifier $370^X$. The pulse compressor 375 may include a refractive or diffractive compressor element. The output signal 380 is a corresponding pulse sequence $PS^C$ wherein the C denotes compressed. By way of non-limiting example, the pulse width of each pulse in the output signal 380 is compressed to produce a pulse width of approximately 100 femtoseconds. Thus, the output signal 380 (i.e., pulse sequence $PS^C$) is an 800 nm wideband light signal wherein each pulse has a pulse width of approximately 100 femtoseconds. Furthermore, in some embodiments, the amplitude of each pulse in the output signal 380 may vary. The resultant output signal 380 from the LIRF stage 350 provides a series of amplified electromagnetic pulses wherein each pulse has a femtosecond pulse width to effectuate reaction of a target surface to promote ejection of electrons from an impinged target surface. In some embodiments, ejected electrons may form transient electric fields in and/or on the object.

In some embodiments, the X laser amplifiers $370^1, \ldots, 370^X$ perform chirped pulse amplification (CPA). The compressor 375 are configured to perform a CPA compression scheme.

In some embodiments, the systems 200 or 300 configured to have high-peak power is in the range of 100 kilowatts (kW) to terawatts (TW).

The higher optical bandwidth is provided by the seed laser pulses from a low power mode locked wideband laser (i.e., master clock 360). The higher optical bandwidth path and elements extend from the master clock 360 to stretcher 365, X (multi-pass) laser amplifiers $370^1, \ldots, 370^X$, and pulse compressor 375.

Figure 4:
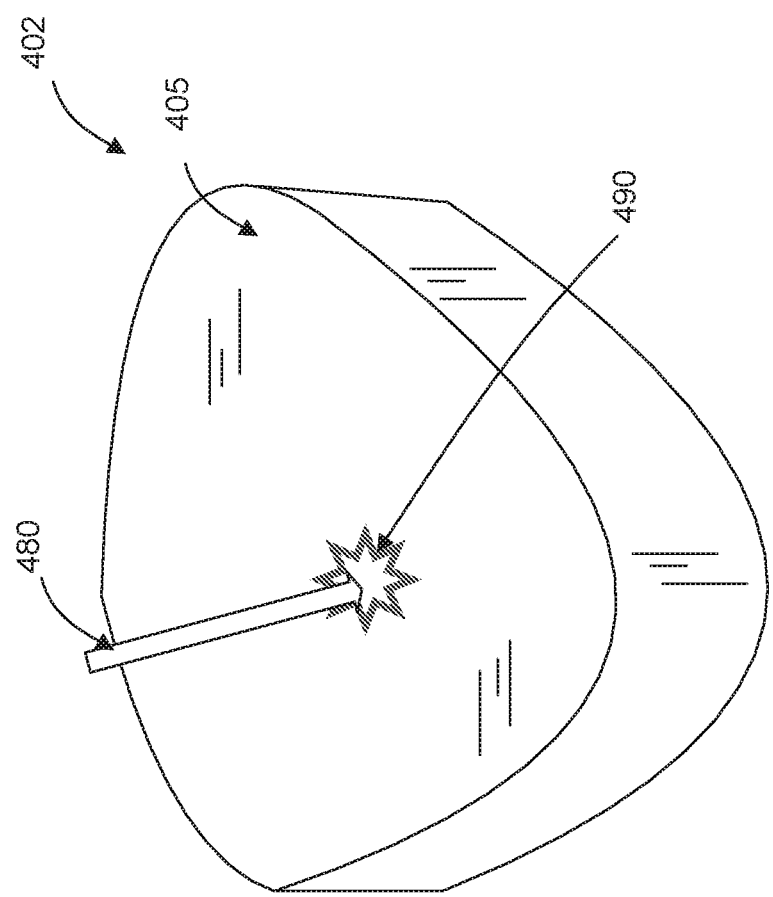
FIG. 4 illustrates a partial view of an object subjected to the directed energy.

FIG. 4 illustrates a partial view of an object 402 subjected to the directed energy. The output signal 380 (i.e., pulse sequence $PS^C$) is propagated through air in the direction toward object 402. The propagated output signal 480 is an 800 nm wideband light signal wherein each pulse has a pulse width of approximately 100 femtoseconds which strikes target surface 405 of the target object 402. The propagated output signal 480 from the LIRF stage 350 provides a series of amplified electromagnetic pulses wherein each pulse has a femtosecond pulse width to effectuate reaction of by the target surface 405 to promote the ejection of electrons in strike area 490 from an impinged target surface. At the strike area 490, transient electric fields may be generated in the object which radiate radio frequency energy or microwave emission energy.

Figure 5:
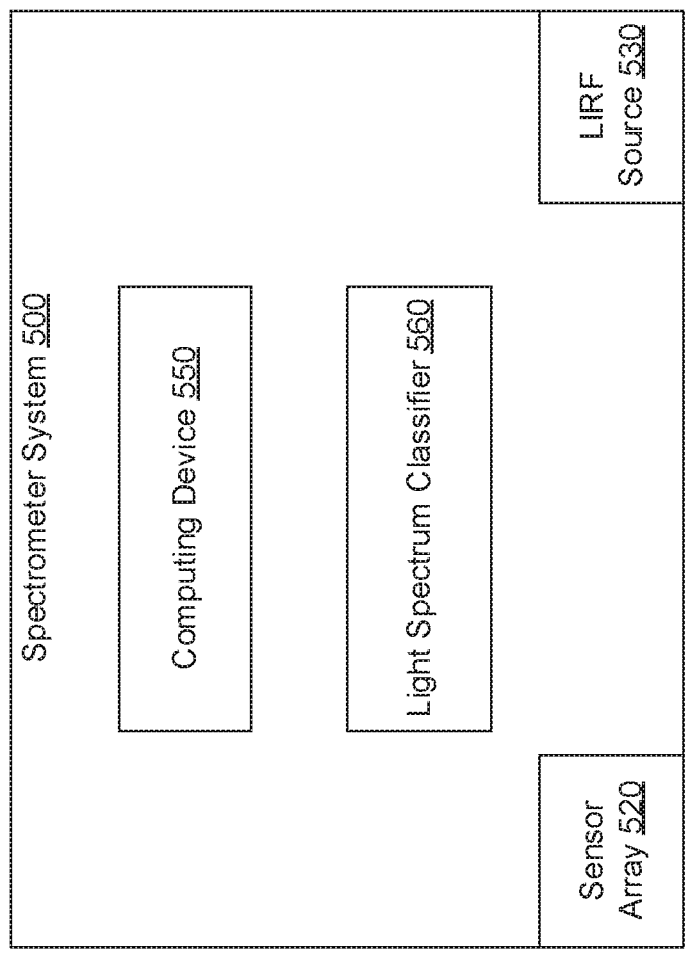
FIG. 5 illustrates a spectrometer system using a burst laser pump system.

FIG. 5 illustrates a spectrometer system 500. The spectrometer system 500 may include at least one sensor or a sensor array 520 to sense light radiating from an object (i.e., object 402). The spectrometer system 500 may also include an LIRF source 530. The LIRF source 530 may include the burst laser pump system 200 (FIG. 2) or 300 (FIG. 3). For example, the LIRF signal has a pulse sequence which is configured to have an enhanced plasma duration at the strike area 490 to increase signal average power for spectroscopy operations. The at least one sensor or a sensor array 520 may sense the light emanating from the strike area 490 over the duration of illumination of the LIRF signal and/or the microwave emission energy.

The spectrometer system 500 may include a computing device 550 and a light spectrum classifier 560. The light spectrum classifier 560 analyzes the light or the average power of the microwave emission energy induced at the surface of the object. The light spectrum classifier 560 includes instructions to measure the amount of laser-induced microwave emission energy from laser source 530 being emitted by the surface material to identify or classify the material of the object based on the detected signal. In some embodiments, the light spectrum classifier 560 may be configured to measure the amount of laser-induced microwave emission energy from laser source 530 being absorbed by the surface material to identify the surface material of the object.

The at least one sensor or sensor array 520 being configured to at least one of detect emissions, detect absorption, and detect scatter by the transient electric fields caused by the LIRF signal. The computing device 550 includes a processor to execute instructions (i.e., light spectrum classifier 560) to identify a material of the solid surface of the object in response to at least one of the detected emissions, detected absorption of the LIRF signal and scatter of the LIRF signal by the material.

In some embodiments, the spectrometer system 500 may be configured to perform remote sensing using the laser-induced microwave emission energy from laser source 530.

Figure 6:
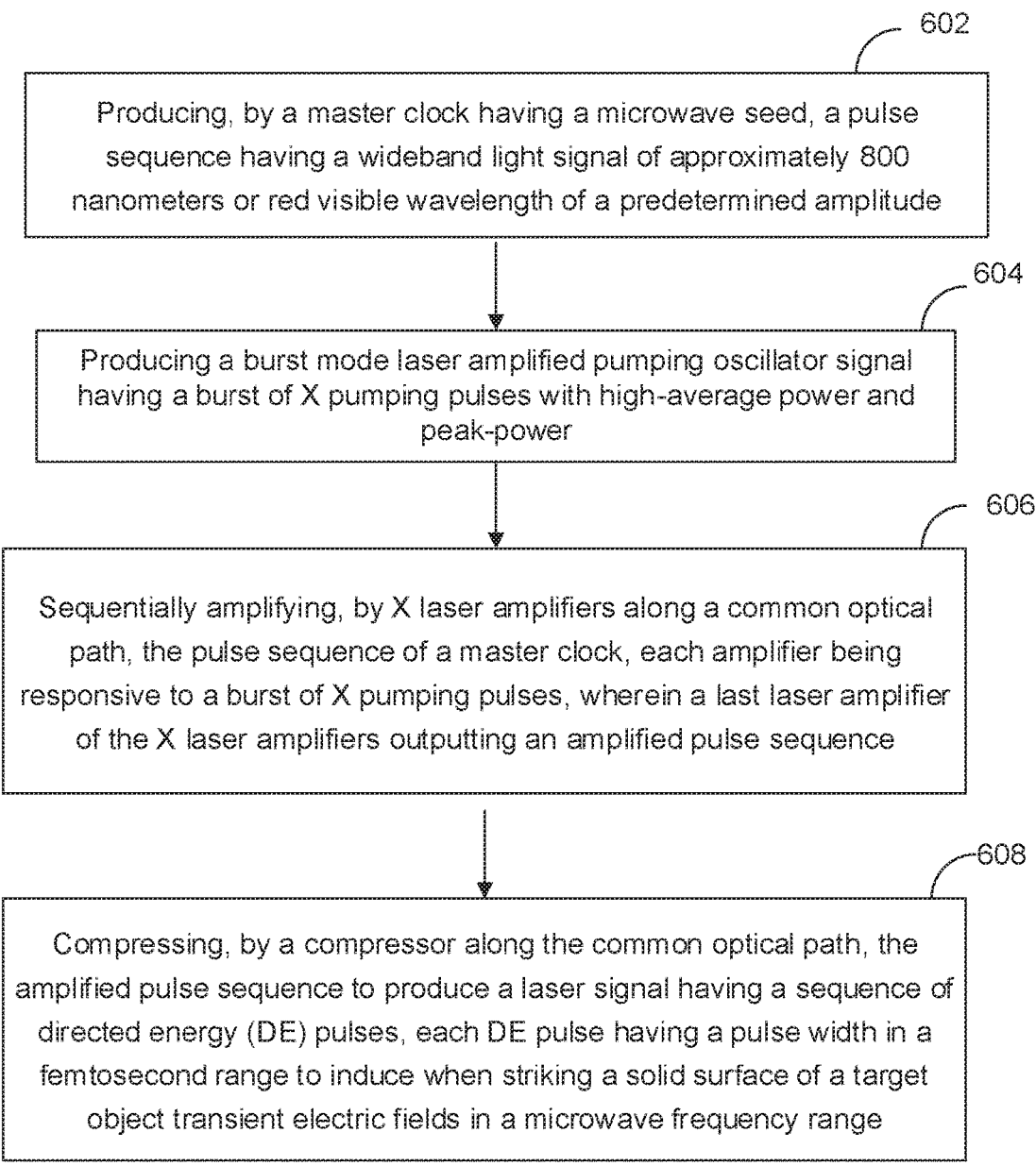
FIG. 6 illustrates a flowchart of a method for forming laser-induced radio frequency (LIRF) energy.

FIG. 6 illustrates a flowchart of a method for forming laser-induced radio frequency (LIRF) energy. The method blocks may be performed in the order shown or a different order. One or more blocks may be performed contemporaneously. One or more blocks may be omitted or added. The method will be described in relation to FIGS. 1A, 2 and/or 3.

The method 600 comprising, at block 602, producing, by a master clock 360 having a microwave seed, a pulse sequence having a wideband light signal of approximately 800 nanometers or red visible wavelength of a predetermined amplitude. At block 604, the method 600 includes producing a high-average power and peak-power burst mode laser amplified pumping oscillator (APO) signal having a burst of X pumping pulses. At block 606, the method 600 includes sequentially amplifying, by X laser amplifiers $370^1, \ldots, 370^X$ along a common optical path, the pulse sequence of a master clock, each amplifier being responsive to the burst of X pumping pulses in the high-average power and peak-power burst mode laser APO signal. The last laser amplifier of the X laser amplifiers outputting an amplified pulse sequence. At block 608, the method 500 includes, compressing, by a compressor along the common optical path, the amplified pulse sequence to produce a laser signal having a sequence of directed energy (DE) pulses each DE pulse having a pulse width in a femtosecond range to induce when striking a solid surface of a target object transient electric fields in a microwave frequency range.

The method at block 604 may include producing, by a low-power oscillator 115 having an oscillator output 116, X number of oscillator pulses 117 in series at a high repetition rate, where X is an integer. The method may comprise triggering in sequence in accordance with the high repetition rate of the oscillator 115, a plurality of X series coupled amplifiers $120^1, 120^2, \ldots, 120^X$. The method may comprise amplifying, by the plurality of X series coupled amplifiers $120^1, 120^2, \ldots, 120^X$ having a first common optical path COP, a power parameter of the X number of oscillator pulses 117. A first amplifier of the plurality of amplifiers $120^1, 120^2, \ldots, 120^X$ is coupled to the oscillator output 116 and an output 125 from a last amplifier of the plurality of X series coupled amplifiers $120^1, 120^2, \ldots, 120^X$ is a burst of X APO pulses 119 with high-peak power and high-average power over the burst of X APO pulses.

The method may include triggering, by a pulse delay generator 140, the oscillator 115 to produce the X number of pulses 117 in series, and triggering, by the pulse delay generator 140, an $i^{th}$ amplifier for only an $i^{th}$ pulse of the X number of pulses 117.

The method may further comprise triggering, by a pulse delay generator 140, the oscillator 115 to produce the X number of pulses 117 in series, and triggering, by the pulse delay generator 140, a respective one amplifier of the plurality of X series coupled amplifiers $120^1$, $120^2$, ..., $120^X$ for only a respective one pulse of the X number of pulses 117.

The embodiments described herein allow a combination of high-peak and high-average power over time periods. Additionally, the embodiments described herein may yield a burst of optical pulses at much higher repetition rates than previously available. By using cascaded amplifiers triggered in a stepped or cascaded fashion, each pulse of the resulting burst is primarily amplified by only one of the sequence of amplifiers in the amplifier chain. The total amplifier chain (i.e., amplifiers $120^1$, ..., $120^X$) would be energized at a nominal relative low repetition rate (i.e., 10 Hz), but the resulting burst of X pulses would be at a considerably higher repetition rate, up to the rate of the oscillator 115. The bursts of X pulses at the rates of the NIR oscillator 115 amplified through the amplifier chain becomes a high-average power, high-peak power burst of NIR energy oscillator pulses which could be used to pump a chirped pulse amplifier (CPA). The embodiments herein may achieve very high-peak power and very high-average power over the duration of the burst from laser output 380 of FIG. 3.

The method 600 may further comprise stretching, by a stretcher 365 coupled to the master clock 360, the pulse sequence, and adapting, by a beam former 367 coupled to the stretcher 365, the stretched pulse sequence to create a predetermined formation on the solid surface.

In some embodiments, the laser amplifiers $370^1$, ..., $370^X$ may cause the amplitude of the amplified pulse sequence to vary such that a first-out pulse has a first amplitude and a last-out pulse has a last amplitude wherein the first amplitude is greater in amplitude than the last amplitude.

The method 600 may further comprise sensing, by a sensor (i.e., sensor array 520), emissions by the transient electric fields, and identifying, by a computing device 550 including a processor, a material of the solid surface of the object in response to the sensed emissions.

Figure 7:
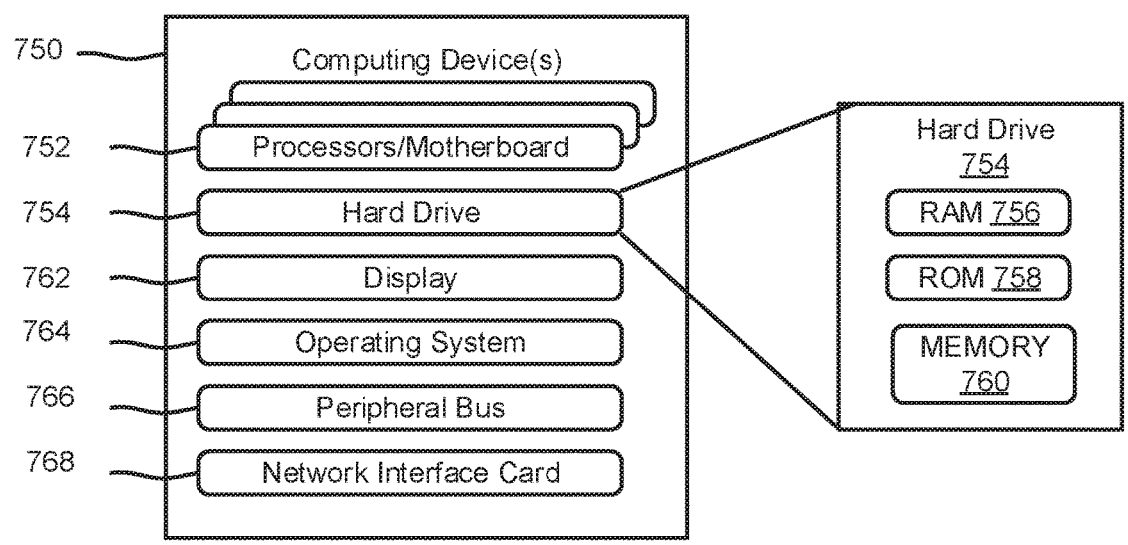
FIG. 7 illustrates a block diagram of an embodiment of a computing device useful for implementing an embodiment disclosed herein.

FIG. 7 illustrates a block diagram of an embodiment of a computing device 750 useful for implementing an embodiment disclosed herein. Computing device 750 may include one or more processors 752 for executing instructions described herein. The computing device 750 may also have additional features or functionality. For example, computing device 750 may include additional data storage devices (removable and/or non-removable) such as, for example, magnetic disks, optical disks, or tape. Computer storage media may include volatile and non-volatile, non-transitory, removable and non-removable media implemented in any method or technology for storage of data, such as computer readable instructions, data structures, program modules or other data to perform spectrometry or remote sensing such as to identify a material of a target object. System memory, removable storage, and non-removable storage are all examples of computer storage media. Computer storage media 754 includes, but is not limited to, RAM 756, ROM 758, Electrically Erasable Read-Only Memory (EEPROM), flash memory 760 or other memory technology, compact-disc-read-only memory (CD-ROM), digital versatile disks (DVD) or other optical storage, magnetic cassettes, magnetic tape, magnetic disk storage or other magnetic storage devices, or any other physical medium which can be used to store the desired data and which can be accessed by computing device. Any such computer storage media may be part of device.

Computing device 750 may also include or have interfaces for input device(s) (not shown) such as a keyboard, mouse, pen, voice input device, touch input device, etc. The computing device 750 may include or have interfaces for connection to output device(s) such as a display 762, speakers, etc. The computing device 750 may include a peripheral bus 766 for connecting to peripherals and operating system 764. Computing device 750 may contain communication connection(s) that allow the device to communicate with other computing devices, such as over a network or a wireless network. By way of example, and not limitation, communication connection(s) may include wired media such as a wired network or direct-wired connection, and wireless media such as acoustic, radio frequency (RF), infrared and other wireless media. The computing device 750 may include a network interface card 768 to connect (wired or wireless) to a network.

Computer program code for carrying out operations described above may be written in a variety of programming languages, including but not limited to a high-level programming language, such as C or C++, for development convenience. In addition, computer program code for carrying out operations of embodiments described herein may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed Digital Signal Processor (DSP) or microcontroller. A code in which a program of the embodiments is described can be included as a firmware in a RAM, a ROM and a flash memory. Otherwise, the code can be stored in a tangible computer-readable storage medium such as a magnetic tape, a flexible disc, a hard disc, a compact disc, a photo-magnetic disc, and a digital versatile disc (DVD).

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising." Moreover, unless specifically stated, any use of the terms first, second, etc., does not denote any order or importance, but rather the terms first, second, etc., are used to distinguish one element from another.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various disclosed embodiments have been described above, it should be understood that they have been presented by way of example only, and not limitation. Numerous changes, omissions, and/or additions to the subject matter disclosed herein can be made in accordance with the embodiments disclosed herein without departing from the spirit or scope of the embodiments. Also, equivalents may be substituted for elements thereof without departing from the spirit and scope of the embodiments. In addition, while a particular feature may have been disclosed with respect to only one of several implementations, such feature may be combined with one or more other features of the other implementations as may be desired and advantageous for any given or particular application. Furthermore, many modifications may be made to adapt a particular situation or material to the teachings of the embodiments without departing from the scope thereof.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present disclosure in any way.

Therefore, the breadth and scope of the subject matter provided herein should not be limited by any of the above explicitly described embodiments. Rather, the scope of the embodiments should be defined in accordance with the following claims and their equivalents.

We claim:

1. A system comprising:
 a burst mode laser amplification stage having an oscillator and X series coupled amplifiers having a first common optical path and which amplify a power parameter of X oscillator pulses, the X series coupled amplifiers are triggered in sequence in accordance with a repetition rate of the oscillator so that an output from a last amplifier of the X series coupled amplifiers is a burst of X amplified pumping pulses wherein the X is a non-zero integer number; and
 a laser-induced radio frequency (LIRF) stage having X series coupled laser amplifiers spaced along a second common optical path, wherein an $i^{th}$ laser amplifier being responsive only to an $i^{th}$ pumping pulse of the burst of X amplified pumping pulses and being configured to amplify a pulse sequence, from an optical master clock having a microwave seed rate: to produce a burst pulse laser signal having a sequence of directed energy (DE) pulses, each DE pulse having a pulse width in a femtosecond range and induces, when striking a solid surface of a target object, transient electric fields in a microwave frequency range and wherein i being a number from 1 to X.

2. The system of claim 1, wherein the master clock is configured to produce the pulse sequence having a wideband light signal of approximately 800 nanometers or red visible wavelength of a predetermined amplitude.

3. The system of claim 1, wherein the LIRF stage further comprises:
 a stretcher having an input coupled to an output of the master clock to stretch the pulse sequence; and
 a compressor coupled to an output of the last laser amplifier of the X laser amplifiers wherein an output of the compressor producing a compressed sequence of directed energy (DE) pulses, wherein each DE pulse of the compressed sequence of DE pulses has the pulse width in the femtosecond range.

4. The system of claim 3, wherein:
 the X laser amplifiers perform chirped pulse amplification (CPA); and
 the compressor employs a CPA compression scheme.

5. The system of claim 3, further comprising a beam former coupled to the stretcher, the beam former configured to adapt the pulse sequence to create a predetermined formation on the solid surface.

6. The system of claim 1, wherein the number X equals 10.

7. The system of claim 1, wherein each amplifier of the X series coupled amplifiers is a near infrared (NIR) amplifier and the X laser amplifiers comprise a Titanium Sapphire multi-pass amplifier.

8. The system of claim 1, further comprising:
 a sensor configured to detect emissions by the transient electric fields; and
 a computing device including a processor to execute instruction to identify a material of the solid surface of the object in response to the detected emissions.

9. A device comprising:
 a master clock having a microwave seed rate and configured to produce, at an output of the master clock, a pulse sequence having a wideband light signal of approximately 800 nanometers or red visible wavelength of a predetermined amplitude;
 a stretcher having an input coupled to the output of the master clock to stretch the pulse sequence;
 X series coupled laser amplifiers along a common optical path, each laser amplifier being triggered by a burst of X amplified pumping pulses and the X series coupled laser amplifiers receive the pulse sequence of the master clock in series and sequentially amplify the stretched pulse sequence and a last laser amplifier of the X series coupled laser amplifiers producing an amplified pulse sequence wherein X is a non-zero integer number; and
 a compressor along the common optical path and being configured to compress the amplified pulse sequence to produce a laser signal having a sequence of directed energy (DE) pulses, each DE pulse having a pulse width in a femtosecond range and induces, when striking a solid surface of a target object, transient electric fields in a microwave frequency range.

10. The device of claim 9, further comprising a beam former coupled to the stretcher, the beam former configured to adapt the pulse sequence to create a predetermined formation on the solid surface.

11. The device of claim 9, wherein:
 the X laser amplifiers perform chirped pulse amplification (CPA); and
 the compressor employs a CPA compression scheme.

12. The device of claim 9, wherein the X equals 10.

13. The device of claim 9, wherein each laser amplifier of the X series coupled laser amplifiers comprises a Titanium Sapphire multi-pass amplifier.

14. The device of claim 9, wherein the amplitude of the amplified pulse sequence varies such that a first-out pulse has a first amplitude and a last-out pulse has a last amplitude wherein the first amplitude is greater in amplitude than the last amplitude.

15. A method comprising:
 producing, by a master clock having a microwave seed rate, a pulse sequence, at an output of the maser clock, having a wideband light signal of a predetermined amplitude;
 producing a burst mode laser amplified pumping oscillator signal having a burst of X amplified pumping pulses;
 sequentially amplifying, by X series coupled laser amplifiers along a common optical path, the pulse sequence of the master clock, wherein an $i^{th}$ laser amplifier being responsive to an $i^{th}$ pumping pulse of the burst of X amplified pumping pulses, wherein a last laser amplifier of the X series coupled laser amplifiers outputting an amplified pulse sequence wherein X is non-zero integer number and i being a number from 1 to X; and compressing, by a compressor along the common optical path, the amplified pulse sequence to produce a laser signal having a sequence of directed energy (DE) pulses, each DE pulse having a pulse width in a femtosecond range and induce, when striking a solid surface of a target object, transient electric fields in a microwave frequency range.

16. The method of claim 15, further comprising:

stretching, by a stretcher coupled to the master clock, the pulse sequence; and adapting, by a beam former coupled to the stretcher, the stretched pulse sequence to create a predetermined formation on the solid surface.

17. The method of claim 15, wherein:

the X laser amplifiers perform chirped pulse amplification (CPA); and the compressor employs a CPA compression scheme.

18. The method of claim 15, wherein the amplitude of the amplified pulse sequence varies such that a first-out pulse has a first amplitude and a last-out pulse has a last amplitude wherein the first amplitude is greater in amplitude than the last amplitude.

19. The method of claim 15, further comprising:

sensing, by a sensor, emissions by the transient electric fields; and identifying, by a computing device including a processor, a material of the solid surface of the object in response to the sensed emissions.

\* \* \* \* \*